(12) United States Patent
Gao

(10) Patent No.: US 8,948,221 B2
(45) Date of Patent: Feb. 3, 2015

(54) EXTERNAL CAVITY WIDEBAND TUNABLE LASER WITH DUAL LASER GAIN MEDIA COUPLED BY A THIN FILM FILTER INCLUDING

(71) Applicant: GP Photonics Inc., Tianjin (CN)

(72) Inventor: Peiliang Gao, Tianjin (CN)

( * ) Notice: Subject to any disclaimer, the term of this patent is extended or adjusted under 35 U.S.C. 154(b) by 0 days.

(21) Appl. No.: 13/975,019

(22) Filed: Aug. 23, 2013

(65) Prior Publication Data

US 2013/0343414 A1    Dec. 26, 2013

Related U.S. Application Data

(63) Continuation of application No. PCT/CN2011/078961, filed on Aug. 26, 2011.

(30) Foreign Application Priority Data

Aug. 4, 2011   (CN) .......................... 2011 1 02220820

(51) Int. Cl.
  *H01S 3/117*   (2006.01)
  *H01S 3/10*    (2006.01)
  *H01S 3/14*    (2006.01)
  *H01S 3/106*   (2006.01)
  *H01S 5/0687*  (2006.01)
  *H01S 5/40*    (2006.01)
  *H01S 5/14*    (2006.01)

(52) U.S. Cl.
  CPC ............. *H01S 3/1068* (2013.01); *H01S 5/0687* (2013.01); *H01S 5/4062* (2013.01); *H01S 5/141* (2013.01)
  USPC .................................. 372/20; 372/13; 372/68

(58) Field of Classification Search
  CPC ....... H01S 3/10; H01S 3/106; H01S 3/10053; H01S 3/23
  USPC ............................................... 372/13, 20, 68
  See application file for complete search history.

*Primary Examiner* — Armando Rodriguez
(74) *Attorney, Agent, or Firm* — Flener IP Law

(57) ABSTRACT

The invention relates to an external cavity wideband tunable laser with dual laser gain media coupled by a thin film filter. The laser comprises: a first laser gain medium, a first laser cavity end mirror arranged on the first laser gain medium, a first intracavity collimating lens, an active optical phase modulator, a tunable acousto-optic filter, an intracavity reflection mirror, an etalon and a total reflection mirror, which are all arranged sequentially inside the laser cavity. The laser further comprises a second laser gain medium, a second laser cavity end mirror arranged on the second laser gain medium, a second intracavity collimating lens, a thin film optical filter for coupling the output light beams emitted from the first laser gain medium and the second laser gain medium, a radio frequency signal source, pumping sources for the two laser gain media, an active optical phase modulator drive source and a laser drive control circuit. The invention expands the output spectrum range of a single tunable laser and is capable of covering C and L spectrum bands. The laser has reliable performance with stable output and compact size, low cost for volume production and easy installation.

17 Claims, 6 Drawing Sheets

EXTERNAL CAVITY WIDEBAND TUNABLE LASER WITH DUAL LASER GAIN MEDIA COUPLED BY A THIN FILM FILTER INCLUDING

CROSS-REFERENCE TO RELATED APPLICATION

The application is a continuation of PCT/CN2011/078961 (filed on Aug. 26, 2011), which claims priority of Chinese patent application 201110222082.0 (filed on Aug. 4, 2011), the contents of which are incorporated herein by reference, as if fully set forth herein.

FIELD OF THE INVENTION

The invention belongs to the field of photonics, and in particular relates to the external cavity wideband tunable laser with dual laser gain media coupled by a thin film filter.

BACKGROUND OF THE INVENTION

Some tuning technologies described below are mainly used in external cavity tunable lasers. First, tuning is carried out by using a precision stepping motor to drive a grating to rotate, and this technology has the following shortcomings: 1), there are high requirements on precision and repeatability of the stepping motor in achieving optical frequency precision tuning, thus the cost is high; 2), the purpose of miniaturization is hardly achieved due to the stepping motor used; and 3), the working stability is poor under a harsh working environment, in particular, prone to various mechanical vibrations. Because of these problems, the tunable laser using this technology is only suitable for use under a laboratory working environment. Second, tuning is carried out based upon the temperature-based shift of the optical frequency of grating or other optical filtering devices in laser resonant cavity, such as an etalon. This tuning technology has high tuning precision and relatively narrow spectrum bandwidth of output light, but low tuning speed. This shortcoming becomes noticeable especially in the case that wide spectral range tuning is needed. For example: if the temperature shift coefficient of an optical filtering device is 0.2 nanometers/degree, the desired spectrum tuning range and temperature adjustment range are 80 nanometers and 400 degrees respectively, which is impracticable in practical application. Third, tuning is carried out by Micro Electronic Mechanical System (MEMS). This technology has a main shortcoming that the working stability is very poor under a harsh working environment, in particular, prone to various mechanical vibrations. Fourth, tuning is carried out by a tunable acousto-optic filter. This technology has the advantages of high tuning speed, no mechanical movement component and small size, but low tuning precision and relatively wide filtering bandwidth. Therefore, the tunable laser using this technology is only suitable for applications in which the requirement of tuning precision and the output bandwidth are not high. Finally, the tunable lasers using a single laser gain medium can hardly cove both the C and L bands.

To sum up, the existing technologies cannot satisfy a variety of applications of the tunable lasers in which miniaturization, fast tuning within a wide spectrum range, narrowband laser output and long-term stable working under a harsh environment are required, especially for applications in fiber optical communication filed.

BRIEF DESCRIPTION OF THE DRAWINGS

FIG. 3-1 is a wave vector relation view of incident beam of the first diffraction, the acoustic wave field and the diffracted light beam in the acousto-optic crystal;

FIG. 3-2 is a wave vector relation view of incident beam of the second diffraction, the acoustic wave field and the diffracted light beam in the acousto-optic crystal;

DETAILED DESCRIPTION OF THE INVENTION

Figure 1:
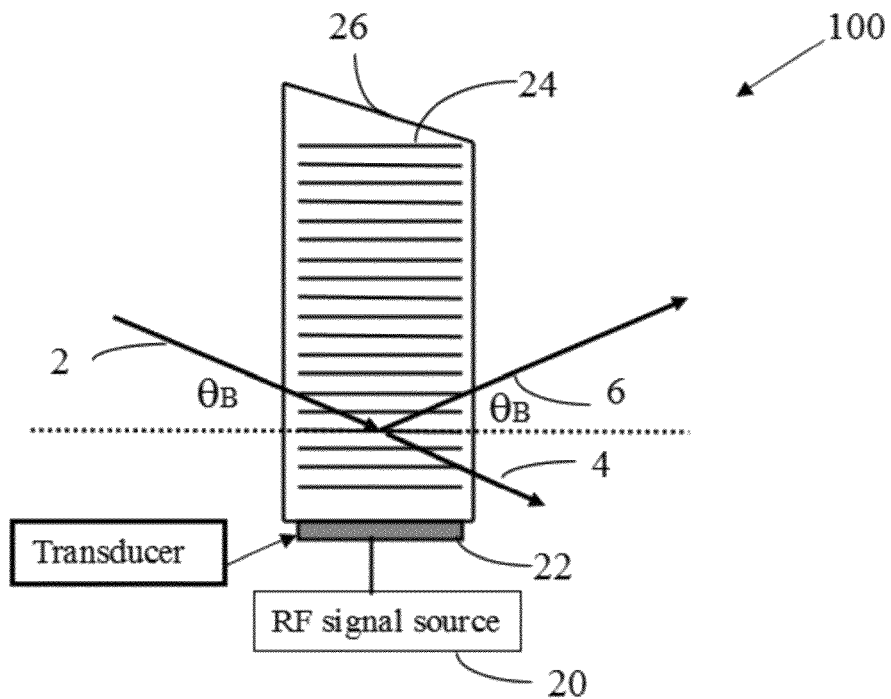
FIG. 1 is a schematic diagram of an existing conventional tunable acousto-optic filter.

It is an objective of the invention to overcome the shortcomings in the prior art and to provide an external cavity wideband tunable laser with dual laser gain media coupled by a thin film filter with stable performance, compact size, low cost and easy for volume production.

The technical scheme below is adopted by the invention for solving the technical problems in the prior art:

An external cavity wideband tunable laser with dual laser gain media coupled by a thin film filter including: a first laser gain medium, a first laser cavity end mirror arranged on the first laser gain medium, a first intracavity collimating lens, an active optical phase modulator, a tunable acousto-optic filter, an intracavity reflection mirror, which are all arranged sequentially, an etalon and a total reflection mirror, which are arranged on the opposite side of the tunable acousto-optic filter from the intracavity reflection mirror, the laser further comprises:

a second laser gain medium, a second laser cavity end mirror arranged on the second laser gain medium, a second intracavity collimating lens, the optical axes of second laser gain medium and the second intracavity collimating lens being vertical to the optical axes of the first laser gain medium and the first intracavity collimating lens;

a thin film optical filter with its optical axis arranged with 45 degrees angle with respect to the output light beams of the first intracavity collimating lens and the second intracavity collimating lens respectively to pass the lights beam from the first intracavity collimating lens and to reflect the lights beam from the second intracavity collimating lens;

a radio frequency signal source for providing radio frequency energy for the tunable acousto-optic filter and for adjusting the oscillation wavelength of the laser resonant cavity by changing RF frequency;

pumping sources for the two laser gain media, an active optical phase modulator drive source and a laser drive control circuit.

Further, the gain spectra of the first laser gain medium and the second laser gain medium are C band and L band respectively.

Further, the first laser cavity end mirror is a total reflection mirror or a partial reflection mirror within the C band range, and the second laser cavity end mirror is a total reflection mirror or a partial reflection mirror within the L band range.

Further, the thin film optical filter is approximately transparent for C band light beams and approximately total reflection for L band light beams.

Further, the intracavity total reflection mirror has approximately 100% reflectivity within the C band and the L band, and is one of the following types of reflective mirrors: plane mirror, convex mirror and concave mirror.

Further, the spectrum range of the etalon is more than or equal to a spectral band ranging from 186.15 THz to 196.10 THz, and the etalon has a free spectrum range of 50 GHz and a high finesse; the spectrum range of the active optical phase modulator is more than or equal to a spectral band ranging from 186.15 THz to 196.10 THz.

Further, the tunable acousto-optic filter is a narrow band optical filter and has a spectrum range equal to or more than a spectral band ranging from 186.15 THz to 196.10 THz, and the FWHM of the filter spectrum of the tunable acousto-optic filter is not more than twice the free spectrum range of the etalon.

Further, the tunable acousto-optic filter comprises an acousto-optic crystal and an acoustic wave transducer bonded to the acousto-optic crystal, and the acousto-optic crystal is $TeO_2$.

Further, the active optical phase modulator is one of the following types: electro-optic phase modulator, or magneto-optic phase modulator, or liquid crystal phase modulator, or acousto-optic phase modulator, or phase modulators based on other forms of physical optical effect, or a combination of the aforementioned phase modulators, and the active optical phase modulator has a spectrum range equal to or more than 186.15 THz-196.10 THz.

Further, the laser drive control circuit comprises: a digital signal processor, four digital-to-analog conversion modules, and the digital signal processor is used for receiving an external instruction signal and to control the laser gain media, the active optical phase modulator, the tunable acousto-optic filter, the laser pumping sources, the active optical phase modulator drive source and the tunable acousto-optic filter drive source.

The invention has the advantages and positive effects that:

1. C band laser gain medium and L band laser gain medium are coupled by a thin film optical filter to significantly expand the output spectrum range of a single tunable laser.

2 A tunable narrowband acousto-optic filter with a single crystal and a single acousto-optic transducer is used in the laser cavity with frequency shift compensation. Fast tuning within C and L band can be achieved with an active optical phase modulator and by change the RF signal frequency applied to the acousto-optic filter. An etalon with 50 GHz free spectrum range and high finesse used for further compression of the laser output spectrum bandwidth, and the laser output can be regulated to meet the requirement of the international standards for fiber optical telecommunication.

3. The narrow band output within a wide spectrum range are realized by the combination of the narrowband acousto-optic filter, the high finesse etalon and two laser gain media, i.e. C band laser gain medium and L band laser gain medium, which are coupled by a thin film optical filter. The invention provides a method to build a tunable laser with no mechanical moving component, fast tuning within a wideband spectrum range, stable and narrowband output under an extreme working environment, low cost for volume production, compact and easy installation. Furthermore, the invention has a variety of applications in optical test, fiber optical communication, biology, medical instrument, fiber sensor network and other fields.

Further detailed description is made below to the embodiments of the invention with reference to the drawings.

FIG. 1 illustrates a conventional tunable acousto-optic filter 100. The tunable acousto-optic filter 100 comprises a transducer 22, a radio frequency signal source 20 and an acousto-optic crystal 26, the transducer 20 is bonded to the acousto-optic crystal. An incident light beam 2 enters the acousto-optic crystal 26 at Bragg angle to generate a zero-order diffraction light beam 4 and a first-order diffraction light beam 6.

Figures 1, 3:
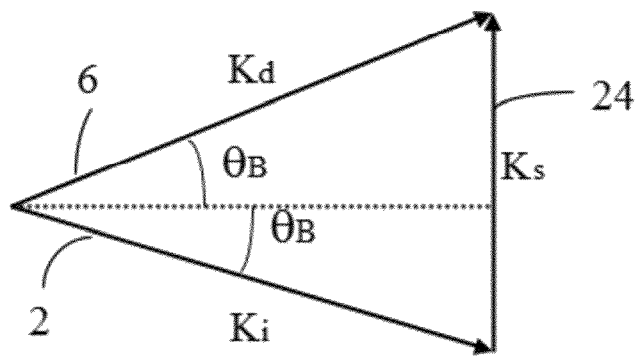
Figures 2, 3:
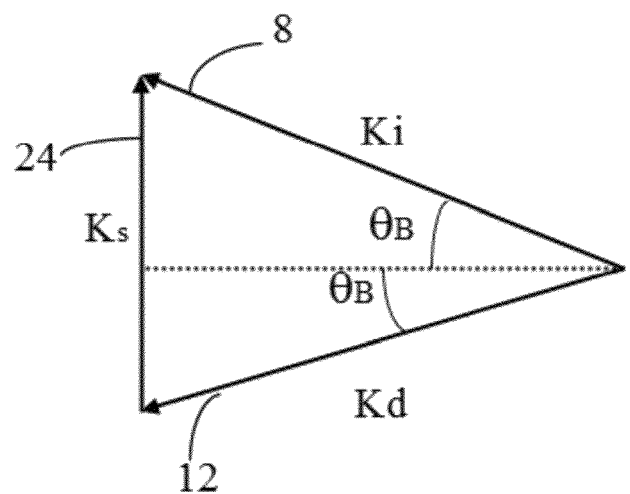

The principle of the acousto-optic filter is based upon a phenomenon known as Bragg diffraction that involves the interaction process of photons (light energy's quanta) and phonons (acoustic energy's quanta). Both energy and momentum are conserved in this interaction process. $\hbar K_d = \hbar K_i + \hbar K_s$ is required in momentum conservation, wherein $\hbar K_d$ is the momentum of diffraction photon, $\hbar K_i$ is the momentum of incident photon and $\hbar K_s$ is the momentum of interactive phonon. The formula below is obtained after $\hbar$ is removed: $K_d = K_i + K_s$, which is the fundamental wave vector equation in Braga diffraction and means that diffracted light wave vector is the vector sum of the incident light wave vector and the acoustic wave vector, as shown in FIG. 3-1. The relation of $(\hbar\omega_r = \hbar\omega + \hbar\Omega)$ is required in energy conservation, wherein $\omega_r$ is the angular frequency of diffraction light, $\omega$ is the angular frequency of incident light and $\Omega$ is the angular frequency of acoustic wave. The formula below is obtained after $\hbar$ is removed: $\omega_r = \omega + \Omega$. This means that the angular frequency of diffraction photon is slightly altered by the angular frequency of acoustic wave, or so called Doppler frequency shift. Acousto-optic Tunable Filter (AOTF) 100 is a solid-state bandpass optical filter that can be tuned by electric signal. Compared with the traditional techniques, AOTF provides continuous and fast tuning capability with narrow spectrum bandwidth. Acousto-optic filters can be divided in two categories: collinear and non-collinear. Narrow-band filtering can be realized by a non-collinear and far off-axis type filter. From the formula $\omega_r = \omega + \Omega$, it is known that the magnitude of the frequency shift of light wave is equal to the frequency of acoustic wave.

While Doppler frequency shift in AOTF is small because acoustic wave frequency is of many orders of magnitude smaller compared with the light wave frequency unstable operation can still arise in some laser systems. A solution to this problem is the use of two AOTFs in which the second AOTF is used for offsetting the frequency shift caused by the first AOTF. Another solution is the use of two transducers on a single acousto-optic crystal. But these solutions have a few shortcomings such as 1), the increase of system size and electric power consumption, 2), more difficult for optical alignment, 3), unstable operation, and 4), cost increase, which is especially important for mass production.

Figure 2:
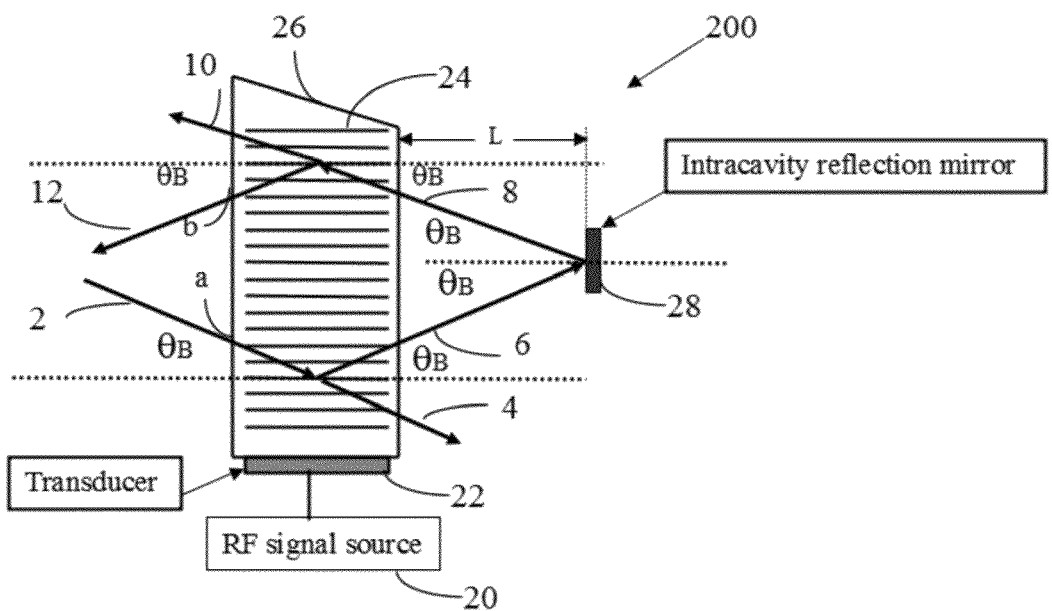
FIG. 2 is a schematic diagram of an existing tunable acousto-optic filter with frequency shift compensation.

FIG. 2 illustrates a tunable acousto-optic filter 200 capable of eliminating frequency shift effectively. The tunable acousto-optic filter 200 comprises a transducer 22, an acousto-optic crystal 26, a radio frequency signal source 20 and a total reflection mirror 28, an incident light beam 2 enters the acousto-optic crystal 26 at Bragg angle to generate a zero-order diffracted light beam 4 and a first-order diffracted light beam 6, which is diffracted again by acousto-optic crystal 26 into a zero-order diffracted light beam 10 and a first-order diffracted light beam 12 after being reflected by the total reflection mirror 28. FIG. 3-1 and FIG. 3-2 illustrate the wave vector relation among incident light ($K_i$), diffraction light ($K_d$) and acoustic wave ($K_s$). As mentioned above, the relation $K_i \pm K_s = K_d$ is always true, whether plus sign (+) or minus sign (−) is used is determined by the direction of incident acoustic wave with respect to that of the acoustic waves. In FIG. 3-1, light 2 ($K_2$), light 6 ($K_6$) and acoustic wave 24 ($K_s$) have such a relation that: $K_2 + K_s = K_4$. The acoustic wave $K_s$ leads to not only upward shift of the diffracted light, but also upward shift of the angular frequency ω of the light by $\Omega = V_s |K_s|$, wherein $V_s$ is the velocity of acoustic wave. In FIG. 3-2, light 8 ($K_8$), light 12 ($K_{12}$) and acoustic wave 24 ($K_s$) have such a relation that: $K_5 - K_s = K_{12}$. In this case, acoustic wave leads to downward shift and also downward shift of the angular frequency ω of the light 12 diffracted by $V_s |K_s|$. The upward and downward shifts are basically the same, so the overall frequency shift is fully eliminated when the light 12 exits from the acousto-optic filter 200.

In some embodiments, for example, when narrow-band tuning is needed, an anisotropic and birefringent acousto-optic crystal is used. One of the crystals is tellurium dioxide ($TeO_2$), which is widely used in such applications because it has high optical uniformity, low light absorbance and high damage threshold to optical power when operating under a shear mode. Other crystals such as lithium niobate ($LiNbO_3$), gallium phosphide (GaP) and lead molybdate ($PbMoO_4$) are also frequently used in a variety of acousto-optic sources. There are several factors that influence the choice of a particular crystal such as the type of acousto-optic source, whether high-quality crystal is easily available and the requirements of a particular application, such as diffraction efficiency, power loss, degree of dispersion of the incident light and the diffracted light and overall source size, etc.

Figure 4:
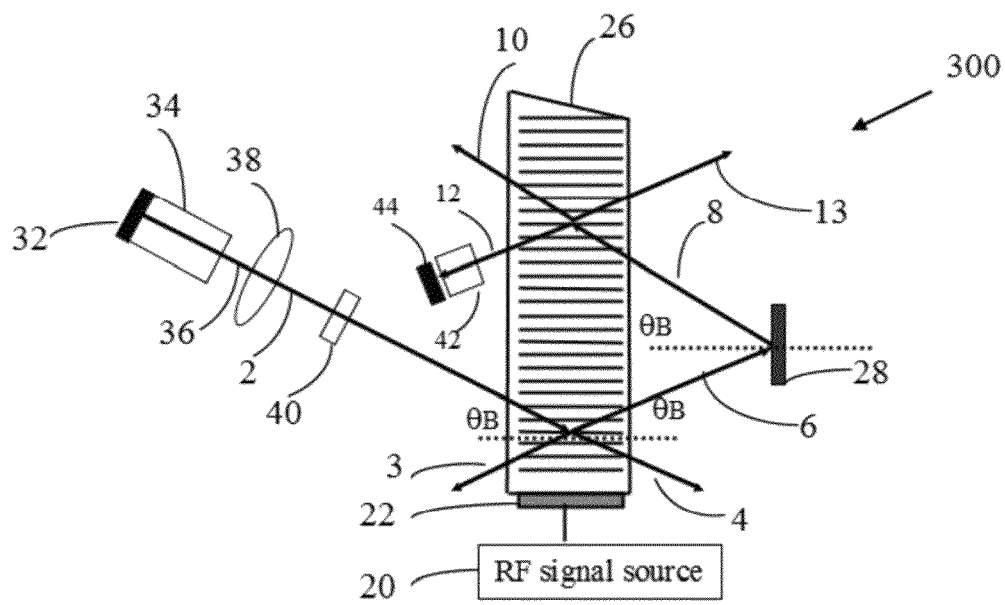
FIG. 4 is a schematic drawing of an external cavity tunable laser using a tunable acousto-optic filter and a single etalon.

FIG. 4 illustrates an external cavity tunable laser 300 using a tunable acousto-optic filter as shown in FIG. 2 and a single etalon. The tunable laser 300 comprises a laser cavity end mirror 32 directly plated on a laser gain medium 34, the laser gain medium 34, an intracavity collimating lens 36, an active optical phase modulator 41, a tunable acousto-optic filter 100, a total reflection mirror 28, an etalon 42 and a total reflection mirror 44, wherein the laser cavity end mirror 2 and the total reflection mirror 44 form a laser resonant cavity.

Laser output mirror differs in reflectivity for light with different wavelengths or colors, and the reflectivity mentioned herein means a reflectivity corresponding to the wavelength bandwidth of an operating laser. The laser cavity end mirror 32 can be either a partial reflection mirror or a total reflection mirror according to different situations. When the laser gain medium is a semiconductor gain medium that has a relatively large output diverging angle, the intracavity collimating lens of the tunable laser 300 is normally used in this case. When the laser gain medium is gas, liquid or some solid media, the intracavity collimating lens is usually not necessary, instead, a non-planar cavity mirror is used to realize proper distribution of intracavity light beams.

When such lasers are used for fiber optical communication, an output light beam 4 needs to be coupled to an optical fiber, so the collimating lens 38 is indispensable.

In the tunable laser 300, a wideband fluorescent light beam 36 emitted from the laser gain medium 34 is collimated by the intracavity collimating lens 38 to form a light beam 2. The light beam 2 enters the tunable acousto-optic filter 26 at Bragg angle after passing through the active optical phase modulator 41 and is diffracted into first order diffracted light 6 and zero order diffracted light 4. The diffracted light beam 6 is reflected by the intracavity total reflection mirror 28 and enters the tunable acousto-optic filter 26 at Bragg angle as light beam 8. The light beam 8 enters the tunable acousto-optic filter 26 at Bragg angle to be diffracted into a first order diffracted light 12 and zero order diffracted light 10. It is worth noting that, the light beam 2 enters the tunable acousto-optic filter 26 at Bragg angle in a direction opposite to the propagating direction of the acoustic wave field 24, while the light beam 8 enters the tunable acousto-optic filter 26 at Bragg angle alone the propagating direction of the acoustic wave field 24. Therefore, the diffracted light beam 12 has zero optical frequency shift from its original light beam 2. The first-order diffraction light beam 12 passes through the etalon 42 and is then reflected back into the laser cavity by the total reflection mirror 44, thus creating laser oscillation and amplification inside the laser cavity. During this process, light beams 4 and 10 are the zero-order diffracted light beams of the light beams 2 and 8 inside the laser cavity; a light beam 13 is a zero-order diffracted light beam of the light beam 12; light beam 3 is also a zero-order diffracted light beam generated inside the laser cavity. All these zero order diffracted beams will become loss inside the laser cavity and leaked out of the laser cavity. The light beam 4 is selected as a laser output light beam due to its largest energy. Light beams 3, 10 and 13 can be used for monitoring the optical power and wavelength inside the laser cavity. Because the light beams 3, 10 and 13 are leaked out of the laser cavity, the use of these light beam for power monitoring purpose does affect the laser operation.

Figure 7:
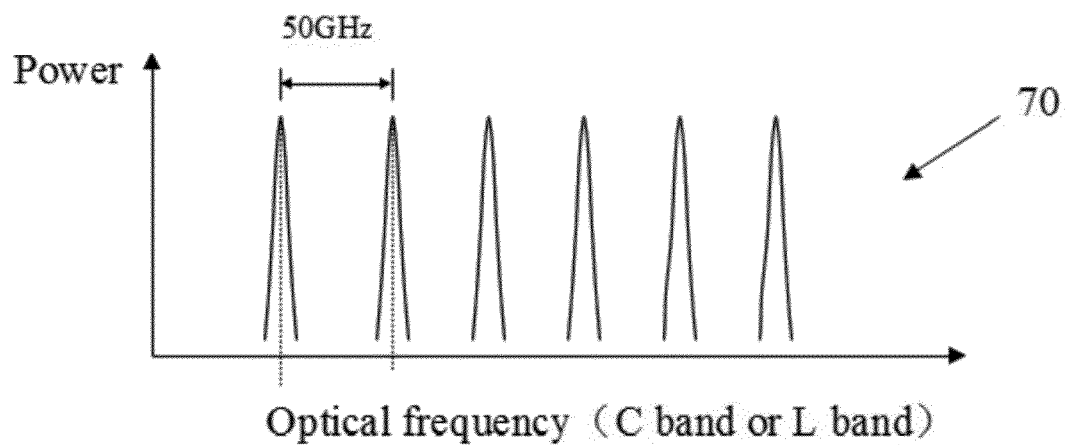
FIG. 7 is an output spectrum diagram of a laser gain medium with 50 GHz free spectrum range.

As previously analyzed, optical wavelength shifts generated by the first diffraction and the second diffraction are just opposite to each other, so the overall optical wavelength shift caused by the tunable acousto-optic filter 26 in the tunable laser 300 is zero. Narrower band laser oscillation occurs due to two diffractions by the tunable acousto-optic filter 26. The etalon 42 that is inserted into the laser cavity is used for further compressing the bandwidth of laser output and regulating the optical frequency interval of output light to be consistent with its free spectrum range (FSR). For applications in fiber optical communication, for example, the etalon 42 may have a free spectrum range of 100 GHz, 50 GHz or 25 GHz and high finesse to increase the side mode suppression ratio and narrow band output. FIG. 7 illustrates the tunable laser 300 output spectrum, which is conventionally used in fiber optical communication within C band or L band spectrum and 50 GHz frequency interval.

Laser output tuning is realized via the active optical phase modulator 41 and the tunable acousto-optic filter 26. The light wave resonant frequency in the laser cavity can be changed by changing the RF frequency of the radio frequency signal source of the tunable acousto-optic filter 26. In accordance with different light wave resonant frequencies, the active optical phase modulator 41 enables a particular light wave to form laser oscillation and amplification in the laser cavity by regulating the phase of the light wave.

Figure 5:
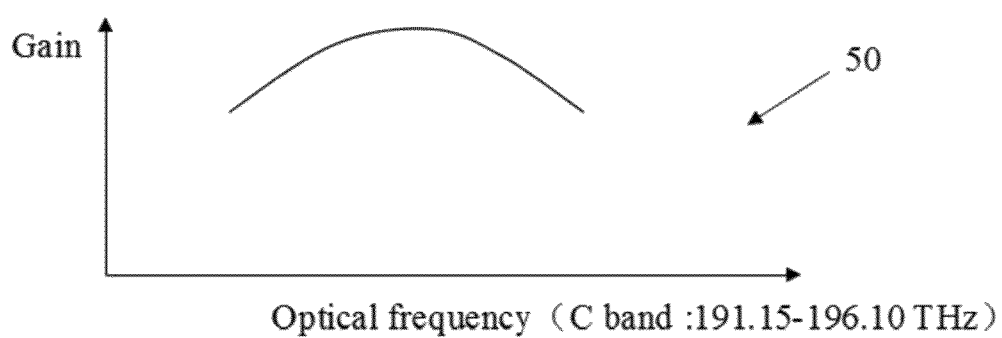
FIG. 5 is a schematic diagram illustrating the laser gain curve of C band.
Figure 6:
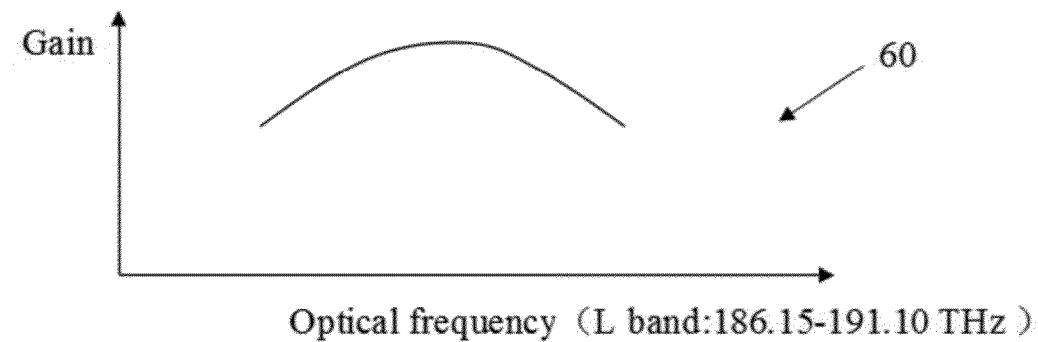
FIG. 6 is a schematic diagram illustrating the laser gain curve of L band.

The spectrum bandwidth of a single laser gain medium is limited, for example, a semiconductor gain medium used in industry has an effective gain bandwidth usually less than 6 THz. Therefore, the tunable spectrum range of the laser 300 using such gain medium is also limited to about 6 THz. It is desirable for many tunable laser applications that the output spectrum range of the tunable laser can be expanded. For example, the range of C band and L band conventionally used in fiber optical communication is about 10 THz, as shown in FIG. 5 and FIG. 6. To achieve such a bandwidth, the use of a single laser gain medium for a tunable laser is not enough.

Figure 8:
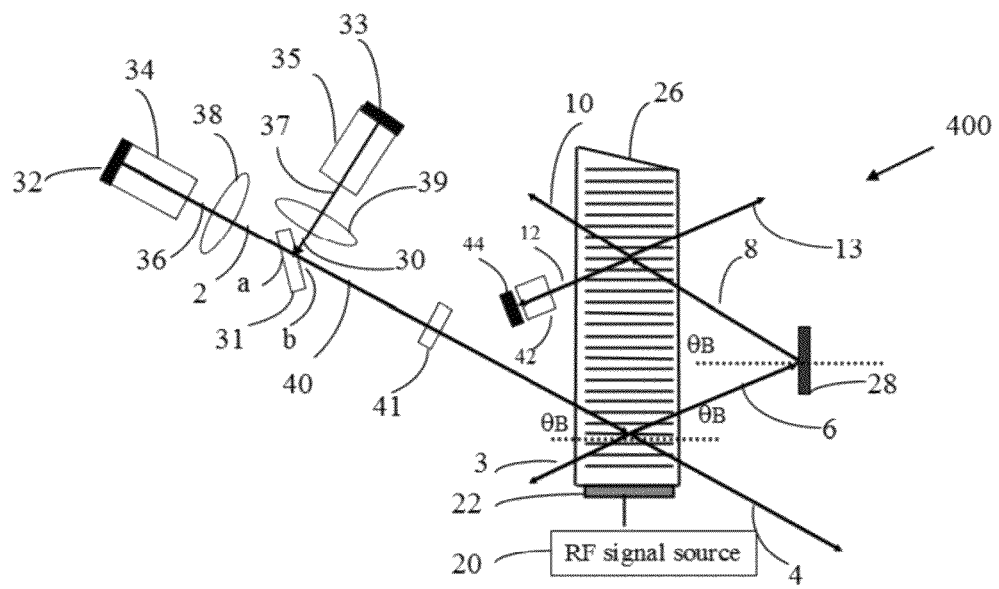
FIG. 8 is a schematic drawing of the invention.

Detailed description is made below to the external cavity tunable laser of the invention:

Provided in the invention is a method for solving the above problems, in which two laser gain media are coupled together by a thin film optical filter. As shown in FIG. 8, the external cavity tunable laser 400 comprises a first laser gain medium

34, a first laser cavity end mirror 32 directly plated on the first laser gain medium 34, a first intracavity collimating lens 38, a second laser gain medium 35, a second laser cavity end mirror 33 directly plated on the second laser gain medium 35, a second intracavity collimating lens 39, a thin film optical filter 31, an active optical phase modulator 41, a tunable acousto-optic filter 26, a total reflection mirror 28, an etalon 42, a laser cavity total reflection mirror 44 and a laser drive control circuit. The tunable laser 400 of the invention and the tunable laser 300 has the same working principle. The difference between them is that the tunable laser 400 has two laser gain media with different spectrum ranges and two laser sub-cavities. The first laser sub-cavity is formed by the first laser cavity end mirror 32, the first laser gain medium 34, the first intracavity collimating lens 38, the thin film optical filter 31, the active optical phase modulator 41, the tunable acousto-optic filter 26, the intracavity reflection mirror 28, the etalon 42 and the laser cavity total reflection mirror 44, and the second laser cavity sub-cavity is formed by the second laser cavity end mirror 33, the second laser gain medium 35, the second intracavity collimating lens 39, the thin film optical filter 31, the active optical phase modulator 41, the tunable acousto-optic filter 26, the intracavity reflection mirror 28, the etalon 42 and the laser cavity total reflection mirror 44. The second laser gain medium 35 and the second intracavity collimating lens 39 are vertically aligned to the first laser gain medium 34 and the first intracavity collimating lens 38, the thin film optical filter 31 is arranged behind the first intracavity collimating lens 38 and the second intracavity collimating lens 39, forms an angle of 45 degrees with respect to the output light beams of the first intracavity collimating lens 38 and the second intracavity collimating lens 39, and is used for coupling the output light beams of the first laser gain medium 34 and the second laser gain medium 35.

In preferred embodiment, the first laser cavity end mirror 32 is a total reflection mirror or a partial reflection mirror within the C band range, and the second laser cavity end mirror 33 is a total reflection mirror or a partial reflection mirror within the L band range. The thin film optical filter 31 has approximately 100 transmissions in C band and approximately 100% total reflection in L band. The laser cavity total reflection mirror 44 and the intracavity total reflection mirror 28 have approximately 100% reflectivity in C band and L band, and is one of the following types of reflection mirrors: plane mirror, convex mirror and concave mirror. The spectrum range of the etalon 42 is more than or equal to a spectral band ranging from 186.15 THz to 196.10 THz, and the etalon has a free spectrum range of 50 GHz and a high finesse. The spectrum range of the active optical phase modulator 41 and the tunable acousto-optic filter 26 have a spectrum range equal to or more than the spectral band ranging from 186.15 THz to 196.10 THz. The tunable acousto-optic filter 26 is narrow band optical tunable filter, with the FWHM (Full width half maximum) of the filter spectrum not more than twice the transmission optical frequency of the etalon 42. The tunable acousto-optic filter 26 comprises an acousto-optic crystal 26 and an acoustic wave transducer 22 adhered to the acousto-optic crystal 26, and the material of the acousto-optic crystal is $TeO_2$. The active optical phase modulator 41 is one of the following types: electro-optic phase modulator, or magneto-optic phase modulator, or liquid crystal phase modulator, or acousto-optic phase modulator, or phase modulators based on other forms of physical optical effect, or a combination of the aforementioned phase modulators, and the active optical phase modulator 41 has a spectrum range equal to or more than 186.15 THz-196.10 THz.

Figure 9:
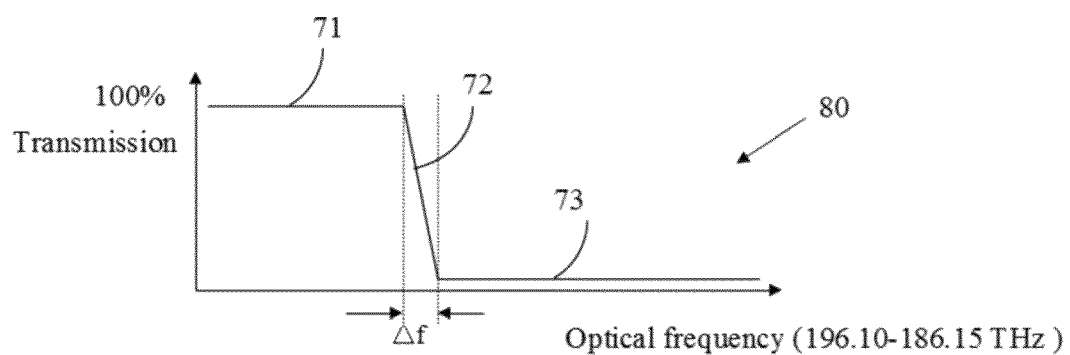
FIG. 9 is a transmission spectrum diagram of the thin film optical filter.

FIG. 5 shows the gain curve of the first laser gain medium 34, and the gain spectrum of the first laser gain medium 34 covers the range of C band or approximately from 191.15 THz to 196.10 THz. FIG. 6 shows the gain curve of the second laser gain medium 35. The gain spectrum of the second laser gain medium 35 covers the range of L band approximately from 186.15 THz to 191.10 THz. FIG. 9 is a transmission spectrum diagram of the thin film optical filter 31. The thin film optical filter 31 of side a (refer to FIG. 8) is an antireflection thin film filter for total transmission in C band. A transmission and reflection curve 80 on the b-side of the thin film optical filter 31 is divided into three sections, i.e. 71, 72 and 73. The section 72 of the curve 80 has a high transmission rate for C band, the section 73 has a high reflectivity for L band, and the section 72 is the transitional section from high transmission rate to low transmission rate, and its spectrum width is Δf. In practice, the Δf of a thin film optical filter will not be zero (smaller Δf leads to higher difficulty in manufacturing the thin film optical filter), so a perfect "clean" coupling of either laser gain medium 34 or 35 cannot be accomplished by the thin film optical filter 31. In fact, the gain spectra of the first laser gain medium 34 and the second laser gain medium 35 will overlap in the section 72. Therefore, the light beams emitted from both laser gain medium in this part of spectrum will form laser oscillation simultaneously, which creates unstable laser output. However, this situation can be avoided in some practical applications. For example, the output of a tunable laser for fiber optical communication has 100 GHz optical frequency interval, the optical frequency interval between the last channel of C band in a long frequency direction and the first channel of L band in a short frequency direction is 100 GHz. Therefore, a perfect "clean" can be achieved when Δf of the filter curve 80 is less than 100 GHz. As for a tunable laser with 50 GHz or 25 GHz optical frequency interval, the difficulty to achieve such a perfect "clean" coupling for the laser gain media of C and L bands by the thin film optical filter 31 is increased dramatically.

Figure 10:
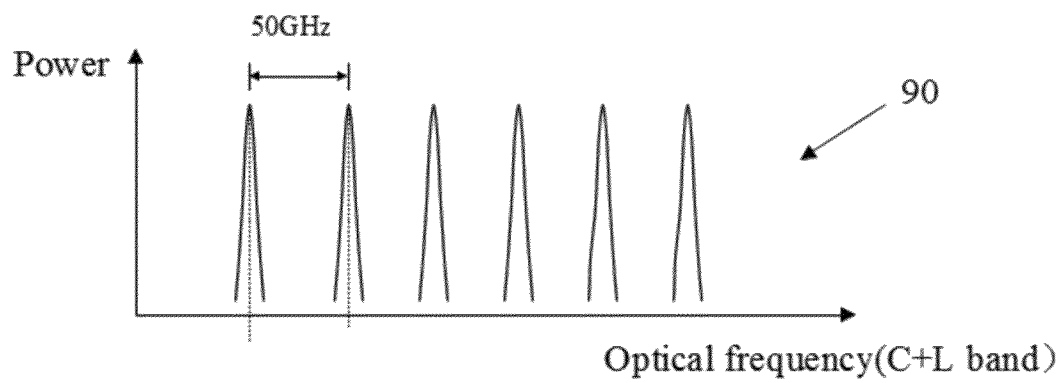
FIG. 10 is an output spectrum diagram of the tunable laser with the optical spectrum covering C and L bands and with 50 GHz free spectrum range.

FIG. 8 is a schematic drawing of the invention. A light beam emitted from the first laser gain medium 34 is collimated by the first intracavity collimating lens 38 to form a light beam 2, a light beam emitted from the second laser gain medium 35 is collimated by the second intracavity collimating lens 39 to form a light beam 30. The thin film optical filter 31 is arranged with 45 degrees angle with respect to the light beams 2 and 30. The light beam 2 passes through the side-a and side-b of the filter 31 and forms laser oscillation in the first laser sub-cavity between the end mirror 32 and the total reflection mirror 44. The light beam 30 is totally reflected by the side-b of the filter 31 and forms laser oscillation, in the second laser sub-cavity between the end mirror 33 and the total reflection mirror 44. Lasers in the first and second sub-cavities can be tuned by adjusting the active optical phase modulator 41 and changing the RF frequency of the radio frequency signal source 20, and both laser sub-cavities output the light beam 4. Therefore, the tunable laser 400 is capable of outputting lights within C and L bands as shown in FIG. 10.

Figure 11:
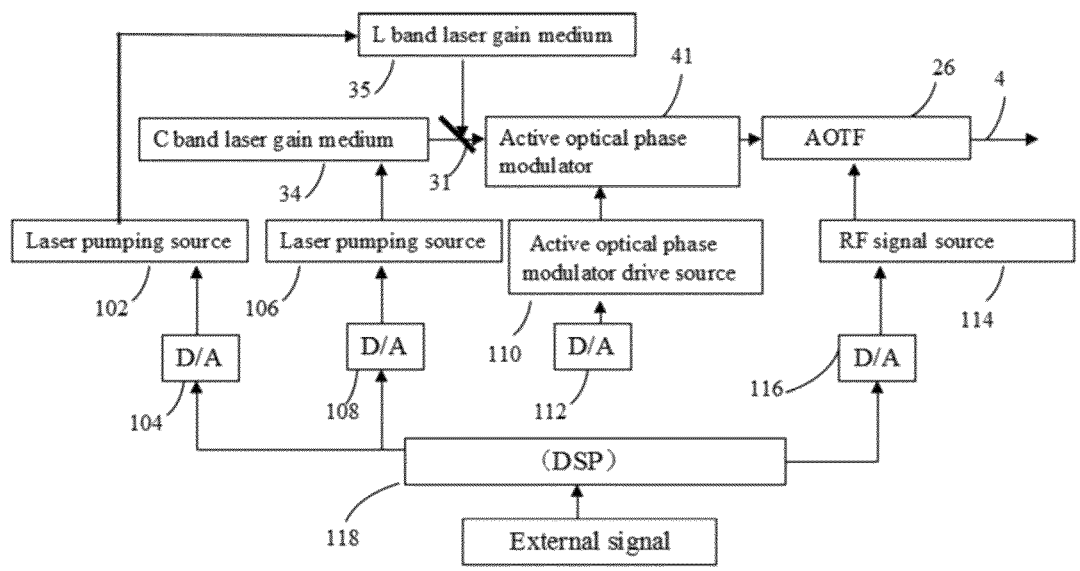
FIG. 11 is a functional block diagram of the laser drive control circuit.

FIG. 11 shows the laser drive control circuit of the external cavity tunable laser 400. The laser drive control circuit comprises a digital signal processor (DSP) 118 with embedded software programs, four digital-to-analog conversion (D/A) devices 104, 108, 112 and 116. The digital signal processor (DSP) 118 with embedded software programs is used for controlling the laser pumping source 102, the laser pumping source 106, the active optical phase modulator drive source 110 and the radio frequency signal source 114 respectively through the digital-to-analog conversion (D/A) devices 104, 108, 112 and 116. The digital signal processor 118 may also receive an external instruction to control the tunable laser 400.

The above description is for demonstration and description only, not a detailed one without omission, and is not intended to limit the invention within the described specific forms. With the aforementioned description, many modifications and variations to the invention are possible. The chosen embodiments are merely for better explanation of the principle and practical applications of the invention. This description enables people familiar with this art to make better use of the invention, and to design different embodiments based on the actual needs and implement corresponding modifications.

What is claimed is:

1. An external cavity wideband tunable laser with dual laser gain media coupled by a thin film filter including: a first laser gain medium, a first laser cavity end mirror arranged on the first laser gain medium, a first intracavity collimating lens, an active optical phase modulator, a tunable acousto-optic filter, an intracavity reflection mirror, which are all arranged sequentially, an etalon and a total reflection mirror, which are arranged on the opposite side of the tunable acousto-optic filter from the intracavity reflection mirror, the laser further comprises:
    a second laser gain medium, a second laser cavity end mirror arranged on the second laser gain medium, a second intracavity collimating lens, the optical axes of second laser gain medium and the second intracavity collimating lens being vertical to the optical axes of the first laser gain medium and the first intracavity collimating lens;
    a thin film optical filter with its optical axis arranged with 45 degrees angle with respect to the output light beams of the first intracavity collimating lens and the second intracavity collimating lens respectively to pass the lights beam from the first intracavity collimating lens and to reflect the lights beam from the second intracavity collimating lens;
    a radio frequency signal source for providing radio frequency energy for the tunable acousto-optic filter and for adjusting the oscillation wavelength of the laser resonant cavity by changing RF frequency; and
    pumping sources for the two laser gain media, an active optical phase modulator drive source and a laser drive control circuit.

2. The external cavity wideband tunable laser with dual laser gain media coupled by a thin film filter of claim 1, wherein the gain spectra of the first laser gain medium and the second laser gain medium are C band and L band respectively.

3. The external cavity wideband tunable laser with dual laser gain media coupled by a thin film filter of claim 1, wherein the first laser cavity end mirror is a total reflection mirror or a partial reflection mirror within the C band range, and the second laser cavity end mirror is a total reflection mirror or a partial reflection mirror within the L band range.

4. The external cavity wideband tunable laser with dual laser gain media coupled by a thin film filter of claim 2, wherein the first laser cavity end mirror is a total reflection mirror or a partial reflection mirror within the C band range, and the second laser cavity end mirror is a total reflection mirror or a partial reflection mirror within the L band range.

5. The external cavity wideband tunable laser with dual laser gain media coupled by a thin film filter of claim 1, wherein the thin film optical filter is approximately transparent for C band light beams and approximately total reflection for L band light beams.

6. The external cavity wideband tunable laser with dual laser gain media coupled by a thin film filter of claim 2, wherein the thin film optical filter is approximately transparent for C band light beams and approximately total reflection for L band light beams.

7. The external cavity wideband tunable laser with dual laser gain media coupled by a thin film filter of claim 1, wherein the intracavity total reflection mirror has approximately 100% reflectivity within the C band and the L band, and is one of the following types of reflective mirrors: plane mirror, convex mirror and concave mirror.

8. The external cavity wideband tunable laser with dual laser gain media coupled by a thin film filter of claim 2, wherein the intracavity total reflection mirror has approximately 100% reflectivity within the C band and the L band, and is one of the following types of reflective mirrors: plane mirror, convex mirror and concave mirror.

9. The external cavity wideband tunable laser with dual laser gain media coupled by a thin film filter of claim 1, wherein the spectrum range of the etalon is more than or equal to a spectral band ranging from 186.15 THz to 195.10 THz, and the etalon has a free spectrum range of 50 GHz and a high finesse; the spectrum range of the active optical phase modulator is more than or equal to a spectral band ranging from 186.15 THz to 196.10 THz.

10. The external cavity wideband tunable laser with dual laser, gain media coupled by a thin film filter of claim 2, wherein the spectrum range of the etalon is more than or equal to a spectral band ranging from 186.15 THz to 196.10 THz, and the etalon has a free spectrum range of 50 GHz and a high finesse; the spectrum range of the active optical phase modulator is more than or equal to a spectral band ranging from 186.15 THz to 196.10 THz.

11. The external cavity wideband tunable laser with dual laser gain media coupled by a thin film filter of claim 1, wherein the tunable acousto-optic filter is a narrow band optical filter and has a spectrum range equal to or more than a spectral band ranging from 186.15 THz to 196.10 THz, and the FWHM of the filter spectrum of the tunable acousto-optic filter is not more than twice the free spectrum range of the etalon.

12. The external cavity wideband tunable laser with dual laser gain media coupled by a thin film filter of claim 2, wherein the tunable acousto-optic filter is a narrow band optical filter and has a spectrum range equal to or more than a spectral band ranging from 186.15 THz to 196.10 THz, and the FWHM of the filter spectrum of the tunable acousto-optic filter is not more than twice the free spectrum range of the etalon.

13. The external cavity wideband tunable laser with dual laser gain media coupled by a thin film filter of claim 1, wherein the tunable acousto-optic filter comprises an acousto-optic crystal and an acoustic wave transducer bonded to the acousto-optic crystal, and the acousto-optic crystal is $TeO_2$.

14. The external cavity wideband tunable laser with dual laser gain media coupled by a thin film filter of claim 2, wherein the tunable acousto-optic filter comprises an acousto-optic crystal and an acoustic wave transducer bonded to the acousto-optic crystal, and the acousto-optic crystal is $TeO_2$.

15. The external cavity wideband tunable laser with dual laser gain media coupled by a thin film filter of claim 1, wherein the active optical phase modulator is one of the following types: electro-optic phase modulator, or magneto-optic phase modulator, or liquid crystal phase modulator, or acousto-optic phase modulator, or phase modulators based on other forms of physical optical effect, or a combination of the aforementioned phase modulators, and the active optical phase modulator has a spectrum range equal to or more than 186.15 THz-196.10 THz.

16. The external cavity wideband tunable laser with dual laser gain media coupled by a thin film filter of claim 2, wherein the active optical phase modulator is one of the following types: electro-optic phase modulator, or magneto-optic phase modulator, or liquid crystal phase modulator, or acousto-optic phase modulator, or phase modulators based on other forms of physical optical effect, or a combination of the aforementioned phase modulators, and the active optical phase modulator has a spectrum range equal to or more than 186.15 THz-196.10 THz.

17. The external cavity wideband tunable laser with dual laser gain media coupled by a thin film filter of claim 1, wherein the laser drive control circuit comprises: a digital signal processor, four digital-to-analog conversion modules, and the digital signal processor is used for receiving an external instruction signal and to control the laser gain media, the active optical phase modulator, the tunable acousto-optic filter, the laser pumping sources, the active optical phase modulator drive source and the tunable acousto-optic filter drive source.

* * * * *